United States Patent
Gaertner et al.

(10) Patent No.: US 9,349,994 B2
(45) Date of Patent: May 24, 2016

(54) LIGHT EMITTING DEVICE WITH IMPROVED INTERNAL OUT-COUPLING AND METHOD OF PROVIDING THE SAME

(71) Applicant: OLEDWORKS GMBH, Aachen (DE)

(72) Inventors: Georg Friedrich Gaertner, Aachen (DE); Gerardus Henricus Rietjens, Stramproy (NL); Joanna Maria Elisabeth Baken, Eindhoven (NL); Johannes 'T Hart, 's-Hertogenbosch (NL); Hans-Peter Loebl, Monschau-Imgenbroich (DE)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 14/441,683

(22) PCT Filed: Oct. 25, 2013

(86) PCT No.: PCT/IB2013/059658
§ 371 (c)(1),
(2) Date: May 8, 2015

(87) PCT Pub. No.: WO2014/072868
PCT Pub. Date: May 15, 2014

(65) Prior Publication Data
US 2015/0311476 A1    Oct. 29, 2015

Related U.S. Application Data

(60) Provisional application No. 61/724,353, filed on Nov. 9, 2012.

(51) Int. Cl.
*H01L 33/00* (2010.01)
*H01L 21/00* (2006.01)
*H01L 51/52* (2006.01)
*H01L 51/00* (2006.01)
*H01L 51/56* (2006.01)

(52) U.S. Cl.
CPC ........ *H01L 51/5275* (2013.01); *H01L 51/0096* (2013.01); *H01L 51/5209* (2013.01); *H01L 51/5215* (2013.01); *H01L 51/56* (2013.01); *H01L 2251/308* (2013.01)

(58) Field of Classification Search
CPC .......................... H01L 51/5275; H01L 51/56
USPC ................................................ 257/98; 438/29
See application file for complete search history.

(56) References Cited

U.S. PATENT DOCUMENTS

2011/0200293 A1    8/2011    Zhang et al.
2012/0091488 A1    4/2012    Vermersch et al.

(Continued)

FOREIGN PATENT DOCUMENTS

| | | |
|---|---|---|
| EP | 1387406 A2 | 2/2004 |
| EP | 2278855 A1 | 1/2011 |
| WO | 2012033322 A2 | 3/2012 |

*Primary Examiner* — David S Blum
(74) *Attorney, Agent, or Firm* — Rossi, Kimms & McDowell LLP

(57) ABSTRACT

The present invention relates to a method of manufacturing a light emitting device with improved internal out-coupling by providing an intermediate layer (11) with a modulated surface. This is achieved by exposure of a flat glass surface (100) to a saturated etching fluid or by providing local changes in the chemical surface composition of the glass substrate or by depositing locally separated sub-μm particles. By removal of the etching fluid, either ultrafine particles (12) are deposited or defects are generated consisting of glass component areas of sub^m-size extension with a high sticking coefficient with respect to the species deposited later on from the gas phase. These ultrafine particles or defects induce locally different growth by different sticking coefficients, with preferential columnar cone shaped growth, leading to small bumps (14) on the top surface of the intermediate layer (11), which are then over-coated with the layers (200) of the light emitting element and induce sufficient scattering by subsequent reflections.

7 Claims, 2 Drawing Sheets

(56) References Cited

U.S. PATENT DOCUMENTS

2012/0112225 A1    5/2012    Le Bellac et al.

2013/0260139 A1*    10/2013    Kamada ................ C03C 17/007 428/328

* cited by examiner

LIGHT EMITTING DEVICE WITH IMPROVED INTERNAL OUT-COUPLING AND METHOD OF PROVIDING THE SAME

CROSS-REFERENCE TO PRIOR APPLICATIONS

This application is the U.S. National Phase application under 35 U.S.C. §371 of International Application No. PCT/IB2013/059658, filed on Oct. 25, 2013, which claims the benefit of U.S. Provisional Patent Application No. 61/724,353, filed on Nov. 9, 2012. These applications are hereby incorporated by reference herein.

FIELD OF THE INVENTION

The invention relates to the field of light emitting devices, more particular medium to large area (small molecule) organic light-emitting diodes, with layer structures comprising organic materials and being obtained by thermal evaporation in vacuum on a light transmitting substrate, e.g. float glass.

BACKGROUND OF THE INVENTION

In recent years, the technology of organic light-emitting diodes (OLEDs) has advanced considerably. The efficiency and lifetime of OLED devices have been improved dramatically and several kinds of OLED displays have been commercialized. OLEDs have many attractive features for display and general lighting applications. They have high brightness, high efficiency, a wide viewing angle, and quick response time. In addition, they can be fabricated by depositing or printing organic materials on a single substrate (e.g. glass substrate), and as such, make it possible to utilize the features of the substrate.

An OLED is a light emitting diode in which an emissive electroluminescent layer is a film of organic compound which emits light in response to an electric current. This layer of organic semiconductor material is situated between two electrodes. Generally, at least one of these electrodes is transparent.

FIG. 1 shows a typical conventional OLED which is composed of a thin transparent anode 10, an organic layer stack 20 with a light emission zone (not shown), a highly refractive intermediate layer 30 deposited on a glass substrate 50, and a cathode layer 40. The organic molecules in den organic layer stack 20 are electrically conductive as a result of delocalization of pi electrons caused by conjugation over all or part of the molecule. These materials have conductivity levels ranging from insulators to conductors, and therefore are considered organic semiconductors. The highest occupied and lowest unoccupied molecular orbitals (HOMO and LUMO) of organic semiconductors are analogous to the valence and conduction bands of inorganic semiconductors. During operation, a voltage is applied across the OLED such that the anode 10 is positive with respect to the cathode 40. As a result, a current of electrons with negative charge flows through the device from the cathode 40 to the anode 10, as electrons are injected into the LUMO at the cathode 40 and withdrawn from the HOMO at the anode 10. This latter process may also be described as the injection of holes into the HOMO. Electrostatic forces attract the electrons and the holes towards each other and they recombine forming an exciton, a bound state of the electron and hole. The decay of this excited state results in a relaxation of the energy levels of the electron, accompanied by emission of radiation whose frequency is in the visible region. The frequency of this radiation depends on the band gap of the material, in this case the difference in energy between the HOMO and LUMO.

The preparation of medium to large area (small molecule) OLEDs, especially of the layer structure consisting of organic materials, is usually carried out by thermal evaporation in vacuum on a light transmitting substrate, e.g. float glass. Unfortunately typically about 50% of the light generated remains in the OLED layer stack 20 (guided modes), about 25% remain in the substrate 50 with low refractive index n and only 20-25% are coupled into air and can be used for lighting applications. This portion of light emitted into air can be increased by a number of measures by about 50% to about 36%, which is still too low for an efficient use of the OLED. A further improvement can be obtained, if a normal glass substrate with a optically thick high refractive index layer (e.g. n=1.8, matching the average index of the OLED layers or of the anode layer) below the OLED and an additional out-coupling structure near the interface is used. Such a solution may be obtained by a rough interface or structured surface 60 between the substrate parts with high refractive index n and low refractive index n. However, an additional roughening step is required, e.g., by grinding, sandblasting and after that rather time-consuming structural etching of the glass (float glass) with low refractive index n is needed.

Then, a step of depositing a smoothing layer (e.g., the intermediate layer 30 with high refractive index) on the structured surface follows, after the roughening and etching steps have been performed, wherein the intermediate layer 30 has a refractive index being larger than the refractive index of the substrate 50. The intermediate layer 30 can be deposited by using e.g. chemical vapor deposition (CVD), wherein grooves of the structured surface 60 are filled with a material having a refractive index being larger than the refractive index of the substrate. For instance, this material can be SiOxNy or Si-Nitride.

SUMMARY OF THE INVENTION

It is an object of the invention to provide an organic light emitting device with an improved out-coupling structure and a method for manufacturing such a device, which do not require the additional roughening step.

This object is achieved by a light emitting device according to the following numbered independent sentence (1):

(1) A light emitting device including: a glass substrate with a flat surface; a high refractive index layer deposited on the flat surface, the high refractive index layer having a refractive index that is higher than that of the glass substrate; and a light emitting layer structure with a transparent electrode layer which is deposited on the high refractive index layer, wherein the flat surface includes seed points for columnar cone shaped growth of the high refractive index layer, the seed points being formed by sub-∥m particles, and wherein bumps are provided on the top surface of the high refractive index layer, the bumps being caused by columnar cone shaped growth of the high refractive index layer.

This object also is achieved by a method according to the following numbered independent sentence (5):

(5) A method of manufacturing a light emitting device, the method including: pre- treating a glass substrate by depositing sub-∥m particles on a flat surface of the glass substrate to form seed points for columnar shaped layer growth on the flat surface; depositing a high refractive index layer on the flat surface so that columnar cone shaped growth of the high refractive index layer generates bumps on a top surface of the high refractive index layer, the high refractive index layer having a refractive index that is higher than that of the glass substrate; and depositing a light emitting layer structure with a transparent electrode layer on the top surface of the high refractive index layer.

Accordingly, the proposed light emitting device comprises a glass substrate with a flat surface, a high refractive index layer deposited on the flat surface, and a light emitting layer structure with a transparent electrode layer which is deposited on the high refractive index layer, wherein bumps are provided on the top surface of the high refractive index layer, the bumps being caused by columnar cone shaped growth of the optically thick high refractive index layer due to local disturbances of layer growth on the flat surface of the glass substrate. Thus, the flat surface can have small local disturbances or defects in the submicron range, with average distances in the 1 to several micron range, the disturbances for subsequent layer growth being provided either by particles of this size and less than ½ monolayer coverage, or by small pins produced by other methods, e.g. a prestructuring of the surface by e.g. optical lithography.

The proposed light emitting device can be manufactured by pre-treating the glass substrate to induce the local disturbances of layer growth on the flat surface of the glass substrate, depositing the high refractive index layer on the flat surface so that the columnar cone shaped growth of the high refractive index layer due to the local disturbances generates the bumps on the top surface of the deposited layer, and depositing the transparent electrode layer of the light emitting layer structure on the top surface of the high refractive index layer. The bumps are thus over-coated with the layers of the light emitting device and induce sufficient scattering by subsequent reflections. An advantage of this process is that no additional roughening step by e.g. grinding, sandblasting and then long-lasting structural etching of the substrate, e.g. low n glass (float glass), is needed before deposition.

According to a first aspect, the flat surface of the glass substrate may comprise ultrafine particles. These ultrafine or sub-μm particles provide seed points for the columnar cone shaped growth of the optically thick high refractive index layer.

According to a second aspect which can be combined with the above first aspect, the flat surface of the glass substrate may comprise local changes in the chemical surface composition of the glass substrate. These local changes may also act as seed points or areas for the columnar cone shaped growth of the optically thick high refractive index layer. In a more specific exemplary implementation of the second aspect, the chemical surface composition of the glass substrate may comprises a material with an element with a different oxidation state which modifies initial growth inhibition by locally higher sticking coefficient and thus stronger growth of the high refractive index layer.

According to a third aspect which can be combined with the above first or second aspect, the flat surface may be exposed to a saturated etching fluid and the etching fluid may then be removed to deposit ultrafine particles consisting of glass component areas of nano-size extension with a high sticking coefficient. The etching fluid can typically contain hydrogen fluoride (HF) and can be saturated with ultrafine particles by etching of another sacrificial substrate (e.g. glass plate). By exposure and removal of the etching fluid the ultrafine particles are deposited consisting of substrate areas of nano-size extensions with a high sticking coefficient. These small ultrafine particles may be inefficient for light scattering, but induce locally different growth by different sticking coefficients, with advantageous columnar cone shaped growth, leading to bumps in a cross-sectional dimension range of 0.5 to 4 μm, preferably 1 to 2 μm, on the top surface of the deposited layer. As an alternative, the etching fluid may be staturated by introducing seed particles into an etching solution.

It shall be understood that the device of the above-discussed numbered independent sentence (1) and the method of the above-discussed numbered independent sentence (5) have similar and/or identical preferred embodiments, in particular, as defined in the following numbered dependent sentences (2)-(4), (6), and (7):

(2) The device according to the above-discussed numbered sentence (1), wherein the high refractive index layer includes SiNx, SiOx, SiOxNy, AlOx, or Al2O3:N.

(3) The device according to the above-discussed numbered sentence (1), wherein the transparent electrode layer includes indium tin oxide or tin-doped indium oxide.

(4) The device according to the above-discussed numbered sentence (1), wherein the bumps have a cross-sectional dimension in the range of 0.5 to 4 ∥m.

(6) The method according to the above-discussed numbered sentence (5), further including exposing the flat surface to an etching fluid that is saturated with sub-∥m particles and removing the etching fluid to deposit the sub-∥lm particles.

(7) The method according to the above-discussed numbered sentence (6), further comprising saturating the etching fluid with sub-∥m particles by etching a sacrificial substrate.

It shall be understood that a preferred embodiment of the invention can also be any combination of the above-discussed numbered dependent sentences with the respective above-discussed numbered independent sentence.

These and other aspects of the invention will be apparent from and elucidated with reference to the embodiments described hereinafter.

DETAILED DESCRIPTION OF EMBODIMENTS

Embodiments are now described based on a OLED structure where a chemical vapour deposition (CVD) layer (SiN or SiON or the like) with high refractive index n is provided on top of a pretreated flat surface of a glass substrate with low refractive index n for optimum internal light out-coupling of OLEDs.

Figure 1:
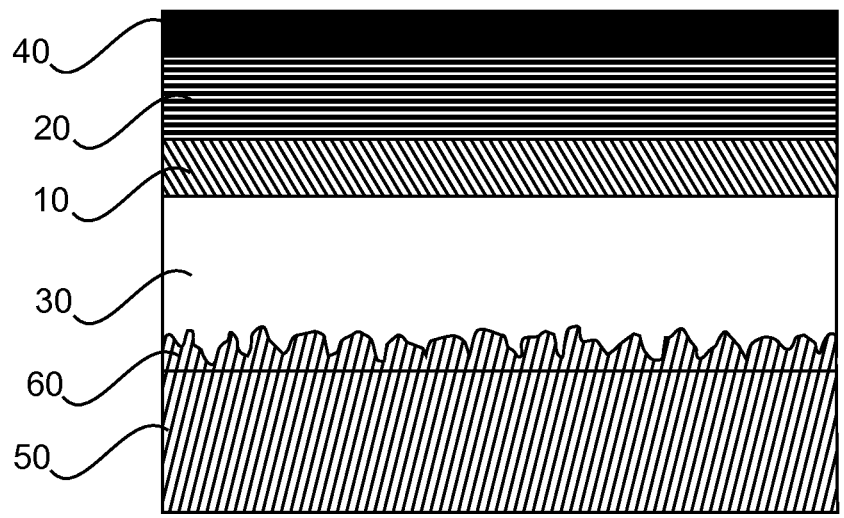
FIG. 1 shows a schematic cross sectional view of a conventional OLED layer structure.

According to various embodiments, a pre-treatment of the glass substrate is done by exposure of the flat glass surface to a saturated etching fluid. The etching fluid can typically contain HF and can be saturated by etching of another sacrificial glass substrate. By exposure and removal of the etching fluid ultrafine particles are deposited consisting of glass component areas of nano-size extension, which are e.g. Ca-enriched or the like with a high sticking coefficient. Subsequently, the CVD layer is deposited on the pretreated surface of the glass substrate. On top of the CVD layer then a anode layer, especially a transparent conductive oxide (TCO), preferentially indium tin oxide or tin-doped indium oxide (ITO, a transparent anode layer) and the respective OLED structure as explained in connection with FIG. 1 is deposited. ITO is a solid solution of indium(III) oxide ($In_2O_3$) and tin(IV) oxide ($SnO_2$), typically 90% $In_2O_3$, 10% $SnO_2$ by weight. It is transparent and colorless in thin layers.

Figure 2:
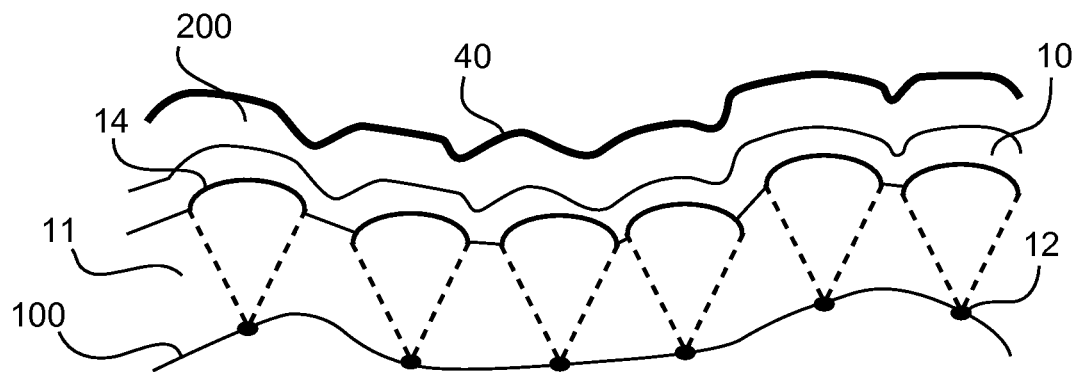
FIG. 2 shows a schematic cross sectional view of an OLED layer structure with improved columnar cone-shaped growth according to a first embodiment.

FIG. 2 shows a schematic cross sectional view of an OLED layer structure with improved columnar cone-shaped growth according to a first embodiment. The small ultrafine particles 12 or other surface defects on the surface 100 of the glass substrate induce locally different growth due to different sticking coefficients, with preferential columnar cone shaped growth, leading to bumps 14 of 0.5 to 4 µm, preferably 1 to 2 µm, cross-sectional dimension on the top surface of the CVD layer 11 underneath the lowest ITO layer (i.e. transparent electrode layer, e.g., anode layer 10) of the OLED layers 200 and the upper cathode layer 40. These bumps 14 are overcoated with the OLED layers 200 and induce sufficient scattering by subsequent reflections at several interfaces and at the cathode layer 40. The sticking coefficient is a term used in surface physics to describe the ratio of the number of adsorbate atoms (or molecules) that do adsorb, or "stick", to a surface to the total number of atoms that impinge upon that surface during the same period of time. Sometimes the symbol $S_c$ is used to denote this coefficient, and its value is between 1.00 (all impinging atoms stick) and 0.00 (none of the atoms stick). The coefficient is a function of surface temperature, surface coverage and structural details as well as the kinetic energy of the impinging particles.

In the first embodiment of FIG. 2, the CVD layer 11 is a silicon oxynitride (SiON) layer which is deposited on a sandblasted or grinded and etched surface 100 of the glass substrate. The use of SiON for the CVD layer 11 is advantageous in that it simultaneously satisfies the moisture impermeability and optical transparency requirements. The small bumps caused by non-uniform CVD layer growth induced by seeding the surface 100 of the glass substrate with ultrafine particles as local disturbancies enhance the haze or efficient scattering.

Figure 3:
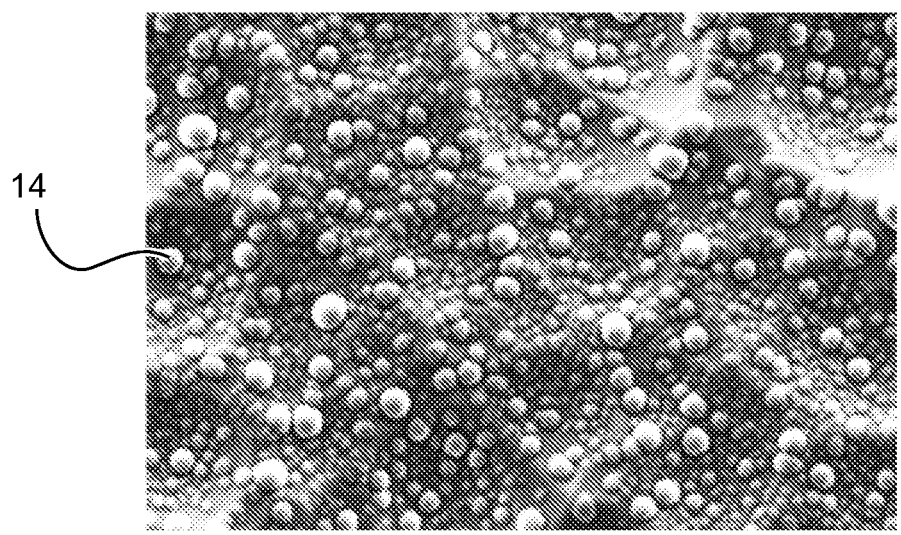
FIG. 3 shows an exemplary top view which illustrates the influence of an ultrafine particle on the substrate surface on the growth of a deposited layer.

FIG. 3 shows an exemplary top view which illustrates the influence of ultrafine particles on the substrate surface on the growth of a 5 µm plasma-enhanced CVD deposition layer of $SiO_xN_y$. The substrate was made of Soda lime glass grinded with SiC and HF etched. Small disturbances are amplified to much larger bumps 14 of a diameter of 0.5 to 4 µm, preferably 1 to 2 µm, in the coating.

In the following, a manufacturing process according to a second embodiment is described. An etching step is introduced as a pre-treatment of the glass substrate, which generates ultrafine particles deposited from the etching solution, which leads to local disturbancies of CVD layer growth. Thereby, relatively large lens like structures can be covered with much finer (mostly) bumps of only 0.5 to 4 µm, preferably 1 to 2 µm, extension. These bumps originated from growth disturbancies in the SiON CVD layer with high refractive index n. Hence, in consequence, it is no longer necessary to provide a rough surface base structure, but a flat glass substrates can be used with a suitable etching solution, eventually after etching a sacrificial glass plate, or by introducing ultrafine seed particles into the etching solution.

Figure 4:
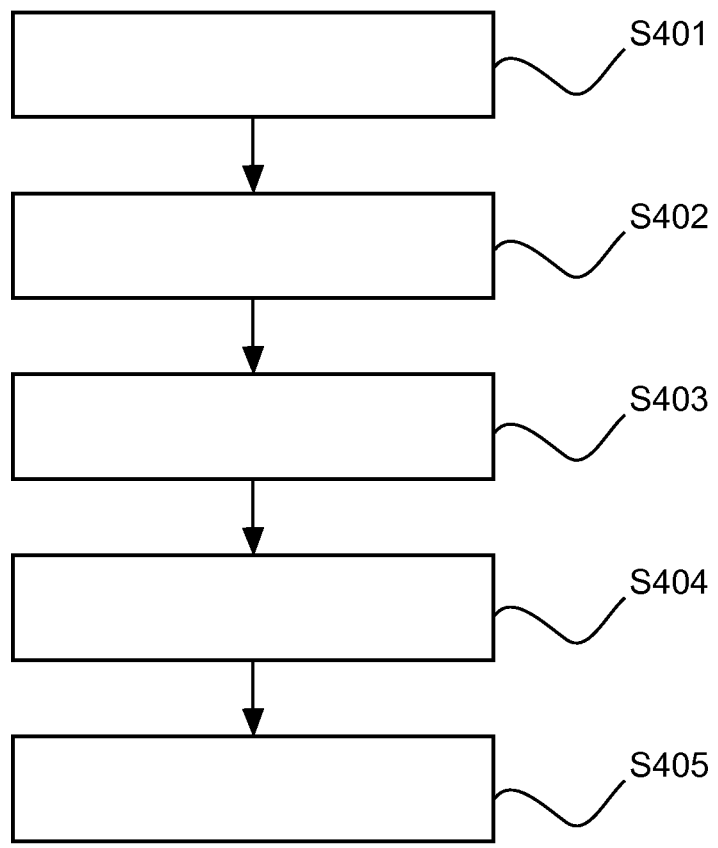
FIG. 4 shows a flow diagram of a manufacturing process according to a second embodiment.

FIG. 4 shows a flow diagram of the manufacturing process according to the second embodiment. In step S401, the pre-treatment is done by exposure of the flat glass surface to a saturated etching fluid. The etching fluid can typically contain HF and can be saturated by etching of another sacrificial glass substrate. By exposure and removal of the etching fluid in step S402, ultrafine particles are deposited consisting of glass component areas of nano-size extension which are e.g. Ca-enriched or the like with a high sticking coefficient. Then, in step S403, for an optimum internal light out-coupling of OLEDs, a high refractive index CVD layer (made of SiN or SiON or the like) is deposited on top of the pre-treated flat surface of the glass substrate. Thereafter, in step S404, a transparent anode layer (made of e.g. ITO) is deposited on top of the CVD layer. Finally, in step S405 the respective OLED layer structure (e.g. as shown in FIG. 1) is deposited on the transparent CVD layer.

Thereby, the achieved different sticking coefficients induce locally different growth, with preferential columnar growth, leading to small bumps of 0.5 to 4 µm, preferably 1 to 2 µm cross-sectional dimension of the CVD layer top surface underneath the transparent anode layer. These bumps are then over-coated with the OLED layers and induce sufficient scattering by subsequent reflections.

It has to be noted, that there are other approaches to induce the above local disturbances of CVD layer growth and induce the cone shaped structures with hemispherical surfaces. Besides using the geometrical effect of nano particles provided on the flat surface of the glass substrate and inducing a three-dimensional disturbance of layer growth, a possible other option is to provide a local change in chemical surface composition.

Thus, according to a third embodiment, the pre-treatment of steps S401 and S402 of the above manufacturing process may be replaced by a step of providing local changes in the chemical surface composition of the glass substrate, e.g., by stronger oxidation (e.g. a material with an element with a higher or at least different oxidation state, thus modifying the initial growth inhibition by locally stronger growth).

Moreover, according to a fourth embodiment, the pre-treatment of steps S401 and S402 of the above manufacturing process may be replaced by a step of inducing disturbances for subsequent growth of the intermediate layer with high refractive index by depositing locally separated sub-µm particles of suitable composition (e.g. from a suspension or solution). Such sub-monolayer submicron particles or preferentially ultrafine (≤100 nm) particles could be e.g. SiC particles or other particles (SiO2, TiO2, MgO, eventually with an organic coating), which can be burnt off or removed after deposition, thus generating a sub-monolayer from a monolayer.

To summarize, a method of manufacturing a light emitting device has been described, with improved internal out-coupling by providing an intermediate layer with high refractive index and with a modulated surface. Bumps or thickness modulations of the intermediate layer are provided by a layer growth method and a flat substrate pre-treatment providing local disturbances for layer growth. This can be done by exposure of the flat glass surface to a saturated etching fluid or by providing local changes in the chemical surface composition of the glass substrate or by depositing locally separated sub-µm particles of suitable composition. By exposure and removal of the etching fluid, either ultrafine particles are deposited or defects are generated consisting of glass component areas of sub-µm-size extension with a high sticking coefficient with respect to the species deposited later on from the gas phase. These small ultrafine particles or defects in the chemical surface composition induce locally different growth by different sticking coefficients, with preferential columnar cone shaped growth, leading to bumps of 0.5 to 4 µm, preferably 1 to 2 µm, cross-sectional dimension of the top surface of a deposited layer. These bumps are then over-coated with the layers of the light emitting element and induce sufficient scattering by subsequent reflections.

While the invention has been illustrated and described in detail in the drawings and foregoing description, such illustration and description are to be considered illustrative or exemplary and not restrictive. The invention is not limited to the disclosed embodiment. It can be applied in any field of organic or even non-organic light emitting devices. Any transparent layer of SiNx, SiOx, SiOxNy, AlOx, and Al2O3:N or other oxide/nitride/carbide/fluoride transparent material with a suitable refractive index films can be employed as CVD layer on the pre-treated substrate of the light emitting device. Moreover, other deposition processes, such as catalyzer-enhanced chemical vapor deposition (CECVD), PECVD or inductively coupled plasma CVD (ICP-CVD), sputtering or laser ablation deposition may be used for achieving the columnar cone-shaped growth.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A light emitting device comprising:
   glass substrate with a flat surface;
   a high refractive index layer deposited on said flat surface, the high refractive index layer having a refractive index that is higher than that of the glass substrate; and
   a light emitting layer structure with a transparent electrode layer which is deposited on said high refractive index layer;
   wherein the flat surface comprises seed points for columnar cone shaped growth of the high refractive index layer, the seed points being formed by sub-µm particles, and
   wherein bumps are provided on the top surface of the high refractive index layer, said bumps being caused by columnar cone shaped growth of the high refractive index layer.

2. The device according to claim 1, wherein said high refractive index layer comprises SiNx, SiOx, SiOxNy, AlOx, or Al2O3:N.

3. The device according to claim 1, wherein said transparent electrode layer comprises indium tin oxide or tin-doped indium oxide.

4. The device according to claim 1, wherein said bumps have a cross-sectional dimension in the range of 0.5 to 4 µm.

5. A method of manufacturing a light emitting device, said method comprising:
   a) pre-treating a glass substrate by depositing sub-µm particles on a flat surface of the glass substrate to form seed points for columnar shaped layer growth on the flat surface;
   b) depositing a high refractive index layer on said flat surface so that columnar cone shaped growth of said high refractive index layer generates bumps on a top surface of said high refractive index layer, the high refractive index layer having a refractive index that is higher than that of the glass substrate; and
   c) depositing a light emitting layer structure with a transparent electrode layer on said top surface of said high refractive index layer.

6. The method according to claim 2, further comprising exposing said flat surface to an etching fluid that is saturated with sub-µm particles and removing said etching fluid to deposit said sub-µm particles.

7. The method according to claim 3, further comprising saturating the etching fluid with sub-µm particles by etching a sacrificial substrate.

* * * * *